United States Patent
Platner et al.

(10) Patent No.: US 11,258,951 B2
(45) Date of Patent: Feb. 22, 2022

(54) MINIATURE CAMERA DEVICE FOR STABILIZED VIDEO USING SHAPE MEMORY ALLOY ACTUATORS

(71) Applicant: MOTOROLA MOBILITY LLC, Chicago, IL (US)

(72) Inventors: David T. Platner, Chicago, IL (US); Cole P. Sheldon, Grayslake, IL (US)

(73) Assignee: Motorola Mobility LLC, Chicago, IL (US)

( * ) Notice: Subject to any disclaimer, the term of this patent is extended or adjusted under 35 U.S.C. 154(b) by 87 days.

(21) Appl. No.: 16/455,606

(22) Filed: Jun. 27, 2019

(65) Prior Publication Data

US 2020/0412927 A1 Dec. 31, 2020

(51) Int. Cl.
*H04N 5/232* (2006.01)
*H04N 5/225* (2006.01)
*G02B 27/64* (2006.01)
*H05K 1/02* (2006.01)

(52) U.S. Cl.
CPC ......... *H04N 5/2328* (2013.01); *G02B 27/646* (2013.01); *H04N 5/2251* (2013.01); *H04N 5/2252* (2013.01); *H04N 5/2253* (2013.01); *H04N 5/2254* (2013.01); *H04N 5/2257* (2013.01); *H04N 5/2259* (2013.01); *H04N 5/23258* (2013.01); *H04N 5/23287* (2013.01); *H04N 5/23299* (2018.08); *G03B 2205/0007* (2013.01); *G03B 2205/0076* (2013.01); *H05K 1/0277* (2013.01); *H05K 2201/05* (2013.01)

(58) Field of Classification Search
CPC . H04N 5/23248–2329; H04N 5/23299; H04N 5/23258; H04N 5/2253; H04N 5/2254; H04N 5/2251; H04N 5/2252; H04N 5/2257; H04N 5/2259; G03B 2205/0007–0038; G03B 2205/0076; G02B 27/646; C22F 1/08; C22F 1/10; C22F 1/006; H05K 1/0277; H05K 2201/05
USPC ........... 348/208.99–208.16, 219.1, 373–376; 359/554–557; 396/13, 52–55, 133
See application file for complete search history.

(56) References Cited

U.S. PATENT DOCUMENTS

| | | | | |
|---|---|---|---|---|
| 7,916,210 B2 * | 3/2011 | Hara | .................. | H04N 5/23258 348/373 |
| 7,952,612 B2 * | 5/2011 | Kakkori | ............. | H04N 5/23248 348/208.6 |
| 8,248,497 B2 * | 8/2012 | Tanimura | ........... | H04N 5/23248 348/294 |
| 8,284,263 B2 * | 10/2012 | Oohara | .................... | G02B 7/08 348/208.7 |

(Continued)

*Primary Examiner* — Jason A Flohre
*Assistant Examiner* — Akshay Trehan
(74) *Attorney, Agent, or Firm* — Isidore PLLC

(57) ABSTRACT

An electronic device includes a gimbal driver and a digital camera. The digital camera includes suspension member(s) attached to a base. The digital camera includes a camera module supported by the suspension member(s). The camera module includes: (i) a lens that focuses an image; and (ii) a sensor attached to the lens and that detects the focused image. Shape memory alloy (SMA) actuator(s) are attached between the base and the camera module. The gimbal driver generates actuating signal(s) in response to movement of the base to stabilize the image. An electrical interconnect directs the actuating signal(s) from the gimbal driver to the SMA actuator(s) to rotate the camera module.

18 Claims, 6 Drawing Sheets

(56) References Cited

U.S. PATENT DOCUMENTS

| | | | | |
|---|---|---|---|---|
| 8,570,384 B2* | 10/2013 | Brown | ............... | H04N 5/23248 |
| | | | | 348/208.11 |
| 8,830,335 B2* | 9/2014 | Topliss | ................. | G02B 27/646 |
| | | | | 348/208.11 |
| 8,866,918 B2* | 10/2014 | Gregory | ................... | G03B 3/02 |
| | | | | 348/208.2 |
| 2003/0076421 A1* | 4/2003 | Dutta | ................ | H04N 5/23258 |
| | | | | 348/208.11 |
| 2006/0272328 A1* | 12/2006 | Hara | ........................ | G03B 5/00 |
| | | | | 60/527 |
| 2007/0279497 A1* | 12/2007 | Wada | ................... | H04N 5/2257 |
| | | | | 348/208.7 |
| 2009/0295986 A1* | 12/2009 | Topliss | ................... | G02B 7/023 |
| | | | | 348/374 |
| 2011/0102668 A1* | 5/2011 | Kaga | ...................... | G03B 17/14 |
| | | | | 348/374 |
| 2011/0249131 A1* | 10/2011 | Topliss | .................... | G03B 5/00 |
| | | | | 348/208.7 |
| 2013/0222685 A1* | 8/2013 | Topliss | ............... | H04N 1/00307 |
| | | | | 348/373 |
| 2014/0028906 A1* | 1/2014 | Chen | ........................ | G03B 5/00 |
| | | | | 348/375 |
| 2014/0368914 A1* | 12/2014 | Hu | ....................... | G02B 27/646 |
| | | | | 359/557 |
| 2018/0171991 A1* | 6/2018 | Miller | ..................... | F16F 15/06 |
| 2019/0136839 A1* | 5/2019 | Miller | ..................... | G03B 3/10 |

* cited by examiner

MINIATURE CAMERA DEVICE FOR STABILIZED VIDEO USING SHAPE MEMORY ALLOY ACTUATORS

1. TECHNICAL FIELD

The present disclosure relates generally to image capturing electronic devices, and in particular to optical image stabilization in image capturing electronic devices.

2. DESCRIPTION OF THE RELATED ART

Mobile electronic devices such as smartphones often include digital cameras that are used to take still images and/or video. Significant development has been made in increasing the resolution and quality of the integrated digital cameras, enabling many users to forgo using single-purpose cameras. However, with the high-resolution performance provided by these integrated digital cameras, any unsteady holding of the mobile electronic device becomes readily apparent when viewing the recorded video. Incorporating image stabilization for miniature digital cameras of mobile electronic devices involves significant trade-offs due to the small form factor. For example, electronic image stabilization (EIS) requires a larger field of view (FOV) in order to crop a smaller stabilized image based on a gyroscopic input, yielding crop artifacts and loss of resolution.

To avoid the crop artifacts and loss of resolution imposed by EIS, optical image stabilization (OIS) techniques using gimbals have been introduced to mobile electronic devices. Gimbals are often used for digital single-lens reflex (DSLR) and action cameras to produce cinematic and smooth video. The gimbals can provide a large range of stroke, approaching 180° with two or three degrees of freedom. However, adapting gimbals as smartphone accessory devices has not received wide-spread adoption due to the associated cost and size. Another OIS technique is to detach the optical lens from the imaging sensor to enable pseudo rotation that does not require a large accessory gimbal. A voice coil motor provides pseudo rotation of one of the lens and the sensor relative to the other is used to provide OIS. However, the current OIS stroke for pseudo rotation is limited to 0.8-1.2° at 6 Hz of pseudo-rotation. Additional misalignment between the lens and sensor unacceptably worsens the video. The current miniature digital camera OIS using pseudo rotation yields auto-focus (AF) and OIS artifacts on video as being an insufficient response to both low and high frequency external translation/rotation inputs.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
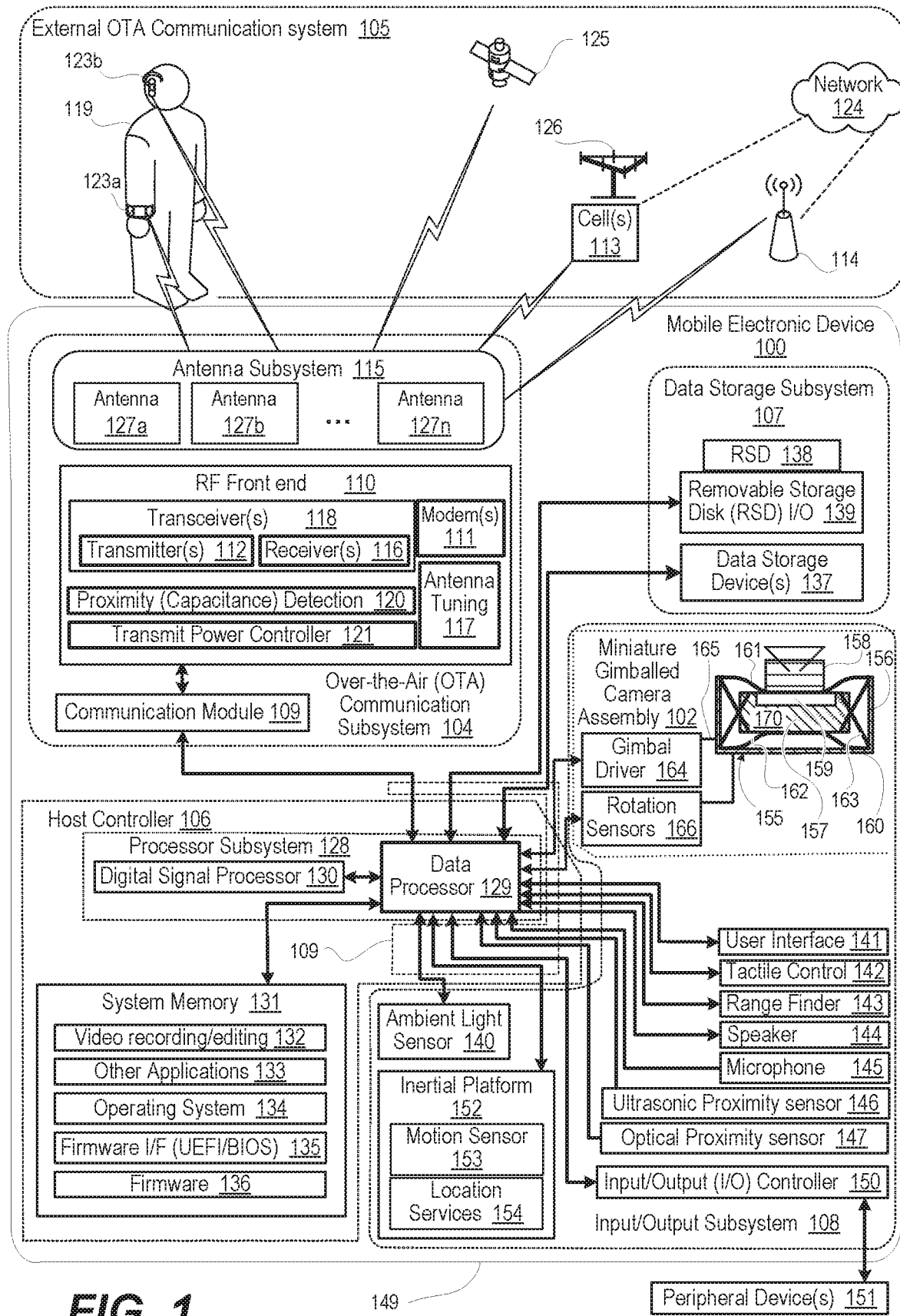
FIG. 1 is a functional block diagram of a mobile electronic device having a miniature gimballed digital camera assembly that performs gimbal stabilization of a digital camera, according to one or more embodiments.

According to aspects of the present innovation, a digital camera, an electronic device, and a method provide for controlling a miniature camera gimbal to provide increased stabilization of a camera. The design providing a miniature digital camera, stabilized by the miniature camera gimbal, can be integrated within the design form factor of mobile electronic devices. The digital camera includes suspension member(s) attached to a base. A camera module is supported by the suspension member(s). The camera module includes a lens attached to a sensor. The lens focuses an image on the sensor that detects the focused image. The digital camera includes shape memory alloy (SMA) actuator(s) that are attached between the base and the camera module. An electrical interconnect directs actuating signal(s) from a gimbal driver of the electronic device to the SMA actuator(s) to rotate the camera module. The actuating signal(s) are generated by the gimbal driver to stabilize the image in response to movement of the base.

In one or more embodiments, the method for controlling the miniature camera gimbal includes detecting a movement of the base of the digital camera. The method includes determining, by a controller, a rotational movement of the camera module of the digital camera that counters the movement of the base. The determined rotational movement is to stabilize an image focused on a sensor of the camera module by a lens of the camera module. The method includes determining, by the controller, a respective amount of opposing actuation of selected SMA actuators attached between the base and opposite corners of an inner holder of the camera module that result in the rotational movement, which will counter the movement of the base. The controller generates respective actuation signals that correspond to the respective amount of opposing actuation of corresponding ones of the selected SMA actuators. The method includes directing the actuation signals to the selected SMA actuators that produce the rotational movement to stabilize the camera module.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof. Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment. It will be appreciated that for simplicity and clarity of illustration, elements illustrated in the figures have not necessarily been drawn to scale. For example, the dimensions of some of the elements are exaggerated relative to other elements.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention.

The description of the illustrative embodiments can be read in conjunction with the accompanying figures. Embodiments incorporating teachings of the present disclosure are shown and described with respect to the figures presented herein.

FIG. 1 is a functional block diagram illustrating example mobile electronic device 100 having miniature gimballed camera assembly 102 that performs gimbal stabilization. Mobile electronic device 100 can be one of a host of different types of devices, including but not limited to, a mobile cellular phone, satellite phone, or smart-phone, a laptop, a net-book, an ultra-book, a networked smart watch or networked sports/exercise watch, and/or a tablet computing device or similar device that can include wireless communication functionality. As a device supporting wireless communication, mobile electronic device 100 can be utilized as, and also be referred to as, a system, device, subscriber unit, subscriber station, mobile station (MS), mobile, mobile device, remote station, remote terminal, user terminal, terminal, user agent, user device, a Session Initiation Protocol (SIP) phone, a wireless local loop (WLL) station, a personal digital assistant (PDA), computer workstation, a handheld device having wireless connection capability, a computing device, or other processing devices connected to a wireless modem. These various devices all provide and/or include the necessary hardware and software to support the various wireless or wired communication functions as part of a communication system. Mobile electronic device 100 can also be an over-the-air link in a communication system. Mobile electronic device 100 can be intended to be portable, hand-held, wearable, detachable, positioned in a fixed location, or mounted to a movable vehicle. Mobile electronic device 100 can have computing functionality directed to local functionality without wide area communication capabilities.

Referring now to the specific component makeup and the associated functionality of the presented components, mobile electronic device 100 includes over-the-air (OTA) communication subsystem 104 that communicates with external OTA communication system 105. Mobile electronic device 100 provides computing and data storage functionality in support of OTA communication with external OTA communication system 105. Mobile electronic device 100 also provides other functions for example with host controller 106, data storage subsystem 107, and input/output (I/O) subsystem 108 that are communicatively coupled to each other via system interlink 109.

OTA communication subsystem 104 includes communication module 109 that operates in baseband frequency range to encode data for transmission and decodes received data, according to a predetermined communication protocol. OTA communication subsystem 104 includes radio frequency (RF) front end 110 having one or more modem(s) 111. Modem(s) 111 modulate baseband encoded data from communication module 109 onto a carrier signal to provide a transmit signal that is amplified by transmitter(s) 112. Modem(s) 111 demodulates the received signal from cell(s) 113 or node 114 detected by antenna subsystem 115. The received signal is amplified and filtered by receiver(s) 116, which demodulate received encoded data from a received carrier signal. Antenna tuning circuitry 117 adjusts antenna impedance of antenna subsystem 115. Antenna tuning circuitry 117 improves antenna efficiency at desired transmit or receive frequencies of transmitter(s) 112 and receiver(s) 116, respectively, within transceiver(s) 118. In one or more embodiments, electronic device 100 is proximate to, or on, a body generating a lossy dielectric effect for mobile electronic device 100. Antenna tuning circuitry 117 is electrically coupled to antenna subsystem 115 to compensate for a lossy dielectric effect of being proximate to a person 119. RF front end 110 can include proximity detection component 120 that monitors for a capacitive effect on antenna subsystem 115 for limiting transmit power set by transmit power controller 121.

Host controller 106 controls the OTA communication subsystem 104, miniature gimballed camera assembly 102, and other functions and/or operations of mobile electronic device 100. These functions and/or operations include, but are not limited to including, application data processing and signal processing. Mobile electronic device 100 may use hardware component equivalents for application data processing and signal processing. For example, mobile electronic device 100 may use special purpose hardware, dedicated processors, general purpose computers, microprocessor-based computers, micro-controllers, optical computers, analog computers, dedicated processors and/or dedicated hard wired logic. As utilized herein, the term "communicatively coupled" means that information signals are transmissible through various interconnections, including wired and/or wireless links, between the components. The interconnections between the components can be direct interconnections that include conductive transmission media or may be indirect interconnections that include one or more intermediate electrical components. Although certain direct interconnections (interlink 109) are illustrated in FIG. 1, it is to be understood that more, fewer, or different interconnections may be present in other embodiments.

In one or more embodiments, host controller 106, via OTA communication subsystem 104, performs multiple types of OTA communication with external OTA communication system 105. OTA communication subsystem 104 can communicate with one or more personal access network (PAN) devices within external OTA communication system 105, such as smart watch 123a and wireless headset 123b that is established via Bluetooth connection. In one or more embodiments, OTA communication subsystem 104 communicates with one or more locally networked devices via a wireless local area network (WLAN) link provided by node 114. Node 114 is in turn connected to wide area network 124, such as the Internet. In one or more embodiments, OTA communication subsystem 104 communicates with global positioning system (GPS) satellites 125 to obtain geospatial location information. In one or more embodiments, OTA communication subsystem 104 communicates with radio access networks (RANs) 126 having respective base stations (BSs) or cells 113. RANs 126 are a part of a wireless wide area network (WWAN) that is connected to wide area network 124 and provides data and voice services. In one or more embodiments, antenna subsystem 115 includes multiple antenna elements 127a-n that are individually tuned to selected RF bands to support different RF communication bands and protocols. Antenna elements 127a-n can be used in combination for multiple input multiple output (MIMO) operation for beam steering and spatial diversity.

Host controller 106 includes processor subsystem 128, which executes program code to provide functionality of mobile electronic device 100. Processor subsystem 128 includes one or more central processing units (CPUs) ("data processor") 129. In one or more embodiments, processing subsystem 128 includes a digital signal processor (DSP) 130. Host controller 106 includes system memory 131, which contains actively used program code and data. In one or more embodiments, system memory 131 includes therein a plurality of such program code and modules, including video recording and editing application(s) 132 and other applications 133. System memory 131 can also include operating system (OS) 134, firmware interface 135 such as basic input/output system (BIOS) or Uniform Extensible Firmware Interface (UEFI), and platform firmware 136. These software and/or firmware modules have varying functionality when their corresponding program code is executed by processor subsystem 128 or secondary processing devices within mobile electronic device 100.

Data storage subsystem 107 provides nonvolatile storage accessible to host controller 106. For example, data storage subsystem 107 can provide a large selection of other applications 133 that can be loaded into system memory 131. In one or more embodiments, local data storage device(s) 137 includes hard disk drives (HDDs), optical disk drives, solid state drives (SSDs), etc. In one or more embodiments, removable storage device (RSD) 138 that is received in RSD interface 139 is a computer program product or computer readable storage device, which can be referred to as non-transitory. RSD 138 can be accessed by host controller 106 to provision mobile electronic device 100 with program code. When executed by host controller 106, the program code provides the functionality to mobile electronic device 100.

I/O subsystem 108 includes external input and output devices. For example, ambient light sensor 140 detects external light for adjusting brightness settings and for also indicating contextual information. User interface device 141 presents visual or tactile outputs as well as receives user inputs. Tactile/haptic control 142 provides an interface such as for braille reading or manual inputs. Range finder 143 emits a waveform of energy, such as acoustic, infrared, RF, etc., whose time of flight is used to measure distance to a reflecting object. Audio speaker 144 provides audio output, including audio playback and alerts. Microphone 145 receives user audible inputs. Ultrasonic proximity sensor 146 detects proximity of an ear of a user to audio speaker 144, including in one or more embodiments recognizing audio feedback from the ear canal. Optical proximity sensor 147 detects proximity of the hand or face of the user to mobile electronic device 100. I/O subsystem 108 can be wholly or substantially encompassed by device housing 149. In one or more embodiments, I/O controller 150 connects to one or more peripheral devices 151 that can include additional I/O functionality. I/O controller 150 can also interface to a wired local access network (LAN) (not shown).

I/O subsystem 108 includes sensors and processing, by inertial platform 152, of orientation, movement and location of mobile electronic device 100. Inertial platform 152 determines a gyroscopic spatial orientation of mobile electronic device 100. Motion sensor 153 detects accelerations of mobile electronic device 100, which can indicate context of use as well as intentional gestures. Accelerations detected by motion sensor 153 can be used to calculate velocity and distance moved, especially when unable to access external location services using location services component 154. Inertial platform 152 also determines compass orientation and the angle of the mobile electronic device 100 with respect to the horizontal plane. When location signals from GPS satellites 125 are received, location services component 154 can determine geographic position and velocity.

Miniature gimballed camera assembly 102 includes at least one miniature gimbaled digital camera 155, each having camera gimbal 156 that rotates camera module 157. Camera module 157 includes lens 158 that focuses an image onto a rigidly attached sensor 159 that detects the focused image. To enable OIS, camera module 157 of digital camera 155 is supported by and decoupled from base 160 of camera gimbal 156 by top and bottom suspension members 161, 162 attached to base 160. One or more shape memory alloy (SMA) actuators 163 are attached between base 160 and inner holder 170 of camera module 157. Gimbal driver(s) 164 of miniature gimballed camera assembly 102 generates actuation signals that are carried by electrical interconnect 165 to SMA actuators 163. Rotation of camera module 157, resulting from actuation of SMA actuators 163, is detected by rotation sensors 166 for closed loop control of OIS. Host controller 106 executes video recording and editing application 132 13 to enable mobile electronic device 100 to: (i) receive gyroscopic movement information from inertial platform 152 based on data from motion sensor 153; (ii) determine a rotational movement of camera module 157 that counters the movement of the mobile electronic device 100 to stabilize the image in sensor 159 of camera module 157;

(iii) determine a respective amount of coordinated, opposing actuation of SMA actuators 163 that result in the determined rotational movement; and (iv) generate the respective actuation signals by gimbal driver 164 that correspond to the respective amount of opposing actuation of corresponding ones of the more than one SMA actuator 163.

Figure 2:
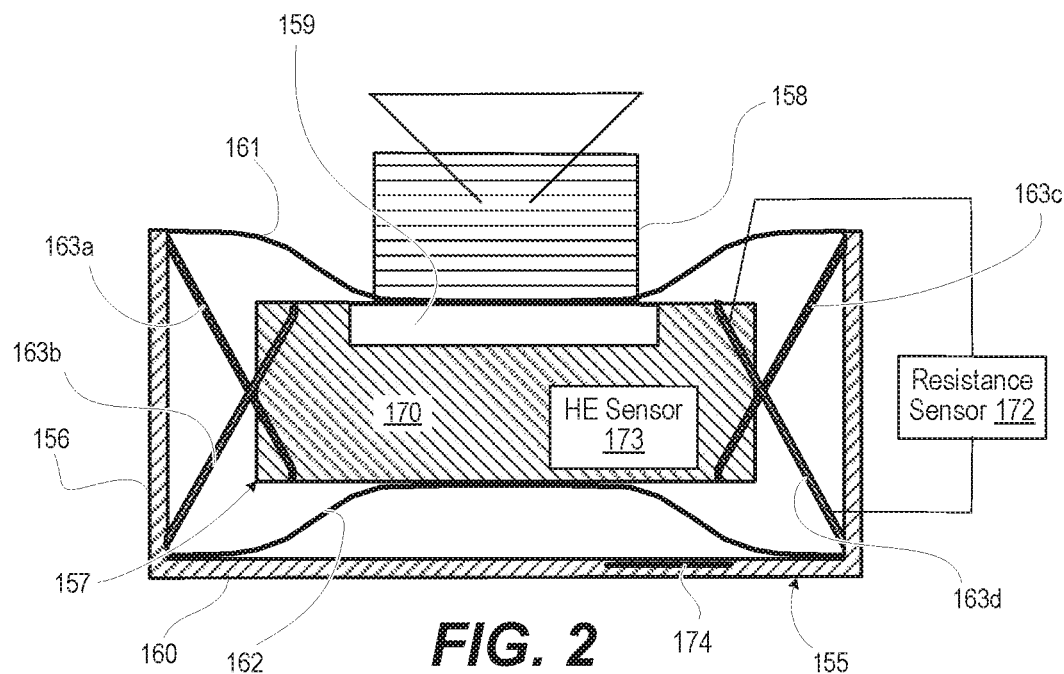
FIG. 2 is a cross section side view of the digital camera of FIG. 1 with a miniature camera gimbal in a neutral position, according to one or more embodiments.

FIG. 2 is a cross section of a side view of digital camera 155 with miniature camera gimbal 156 in a neutral position. Camera module 157 includes lens 158 and rigidly attached sensor 159. For clarity, in one or more embodiments, one-degree of freedom of rotation is provided by four SMA actuators 163a-163d that work either in opposition or cooperation as described below. Top and bottom suspension members 161, 162 hold camera module 157 horizontally within camera gimbal 156. First SMA actuator 163a is attached to a top left corner of inner holder 170 (as viewed) and to a lower left corner of base 160. In one or more embodiments, SMA actuators 163a-163d contract when actuated. When first SMA actuator 163a is actuated, first SMA actuator 163a rotates the top left corner of inner holder 170 downward. First SMA actuator 163a allows left top corner of inner holder 170 to return upward to neutral when SMA actuator 163a is not actuated. Second SMA actuator 163b is attached to a bottom left corner of inner holder 170 and to an upper left corner of base 160. When second SMA actuator 163b is actuated, second SMA actuator 163b rotates the bottom left corner of inner holder 170 upward. Second SMA actuator 163b allows lower left top corner of inner holder 170 to return downward to neutral when not actuated. Third SMA actuator 163c is attached to a top right corner of inner holder 170 and to a lower right corner of base 160. When third SMA actuator 163c is actuated, third SMA actuator 163c rotates the top right corner of inner holder 170 downward. Third SMA actuator 163b allows right top corner of inner holder 170 to return upward to neutral when not actuated. Fourth SMA actuator 163d is attached to a bottom right corner of inner holder 170 and to an upper right corner of base 160. When fourth SMA actuator 163d is actuated, fourth SMA actuator 163d rotates the bottom right corner of inner holder 170 upward. Fourth SMA actuator 163d allows lower right top corner of inner holder 170 to return downward to neutral when not actuated. Digital camera 155 includes rotation sensors such as an electrical resistance sensor 172 that measures an electrical resistance value of selected SMA actuators 163a-d. The electrical resistance is related to the length of SMA actuators 163a-d. Digital camera 155 can include rotation sensors such as Hall Effect sensor 173 that detect distance to ferrous sensor target 174 attached to base 160.

Figure 3:
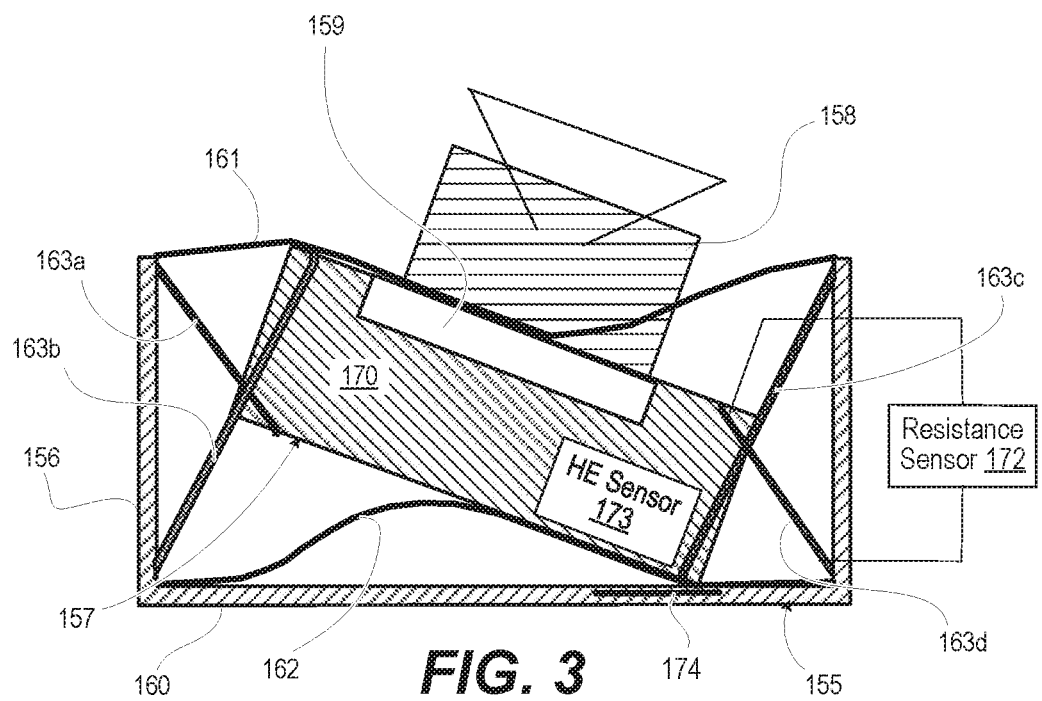
FIG. 3 is a cross section side view of the digital camera of FIG. 1 with the miniature camera gimbal in a rotated position, according to one or more embodiments.

FIG. 3 is a cross section of a side view of the digital camera 155 of FIG. 2 with camera module 157 of miniature camera gimbal 156 in a clockwise rotated position. In FIG. 3, second SMA actuator 163b is actuated. Second SMA actuator 163b raises lower left corner of inner holder 170 upward, passively stretching first SMA actuator 163a, which is not actuated, and overcoming top and bottom suspension members 161, 162. Third SMA actuator 163c is actuated. Third SMA actuator 163c lowers upper right corner of inner holder 170 downward, passively stretching fourth SMA actuator 163d that is not actuated and also overcoming the restoring force of top and bottom suspension members 161, 162. Camera module 157 rotates within camera gimbal 156 while maintaining the alignment of lens 158 and sensor 159. For clarity, camera module 157 rotates in a vertical plane that passes through the corners of inner holder 170, such as plane X-Z. In one or more embodiments, an identical but orthogonal set of corners (not shown) of inner holder 170 are provided, which would be plane Y-Z. SMA actuators (not shown) can act at the same time on these orthogonal corners to a selected degree of rotation to cause rotation in plane Y-Z. The resulting three-dimensional rotation of camera module 157 enables stabilization of camera module 157 to varying three dimensional movements of electronic device 100.

Figure 4:
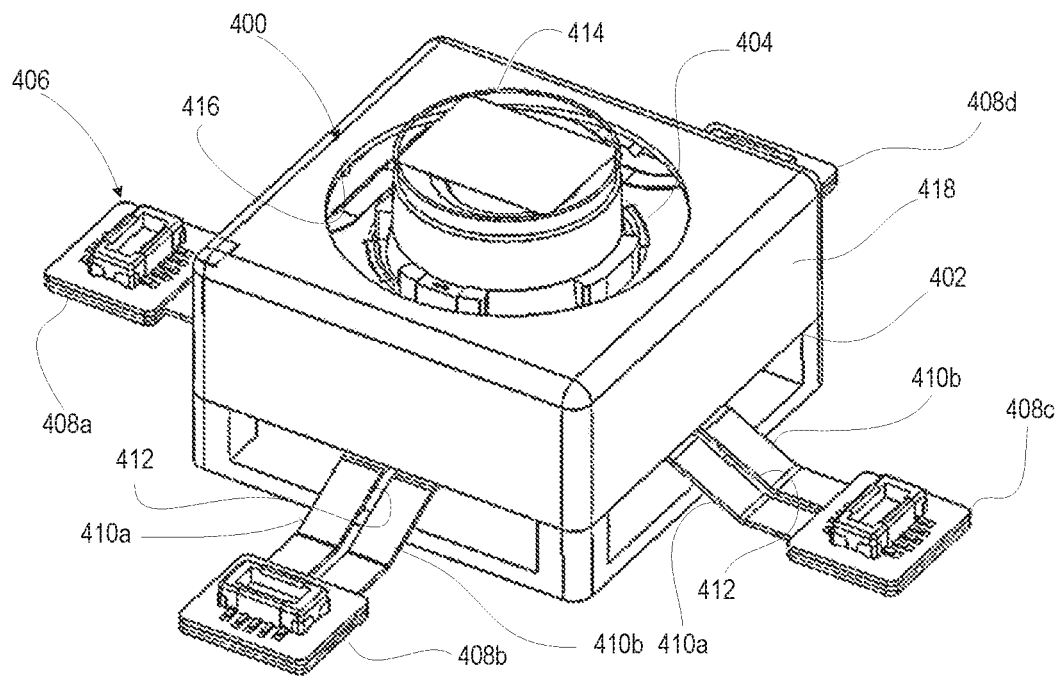
FIG. 4 is an isometric view of an example digital camera, according to one or more embodiments.

FIG. 4 depicts an example digital camera 400 having gimbal stabilization that is small and robust enough to perform well in small user devices. Digital camera 400 includes camera module 404. Camera module 404 is protected by holder base 420 and shield can 418, which, in the illustrated embodiment, is square in shape. Lens 414 of camera module 404 moves within circular aperture 416 of square-shaped shield can 418. Holder base 420 provides an attachment surface for digital camera 400 and supports camera gimbal 402.

For clarity, camera module 404 includes square inner holder 422 that has four identical sides. In one or more embodiments, an inner holder of a camera module (not shown) can have shapes than square, such as rectangular or even an irregular shape that does not include symmetries. In one or more embodiments, an inner holder can have fewer corners, such as having a triangular shape. In one or more embodiments, an inner holder can have more corners, such as a pentagon, hexagon, etc. In one or more embodiments, an inner holder of a camera module can have a round outer surface with lengths of SMA actuators having a midpoint or an endpoint attached to the round outer surface.

A generally-known OIS that uses pseudo rotation of the lens versus the sensor can only achieve about ±0.8° or reportedly up to ±1.2° OIS stroke in some implementations. Digital camera 400 includes camera gimbal 402 and camera module 504. Camera gimbal 402 provides a range of motion (ROM) to camera module 404 of more than ±1.5°. In one embodiment, camera module 404 has a ROM of ±6°. Current fixed focus, non-OIS wide field of view (WFOV) cameras are of size 7.5 mm (X-axis)×7.5 mm (Y-axis)×5.7 mm (Z-axis). Adding SMA type gimbal actuator, as with the current design, results in a camera size of approximately 11.2 mm (X-axis)×11.2 mm (Y-axis)×6.4 mm (Z-axis), and an increase in the shoulder height of 1.0 mm. Electrical interconnect 406 includes 24 pins. Electrical interconnect 406 is divided into four flexible ribbon cables of six (6) pins per flexible arm 408a-d that balance forces around camera module 404. Flexible arm 408a-d have identical dimensions and are positioned with 90° radial spacing to camera module 404. Each flexible arm has six (6) conductors associated with each pin that are divided further into two parallel ribbon cables 410a, 410b of three (3) conductors, each separated by lengthwise slot 412. Camera module 404 can translate vertically and rotate relative to the inward terminations of parallel ribbon cables 410a, 410b. Having half of the width increases flexibility of each parallel ribbon cable 410a, 410b, as compared to a single ribbon cable (not shown).

Figure 5:
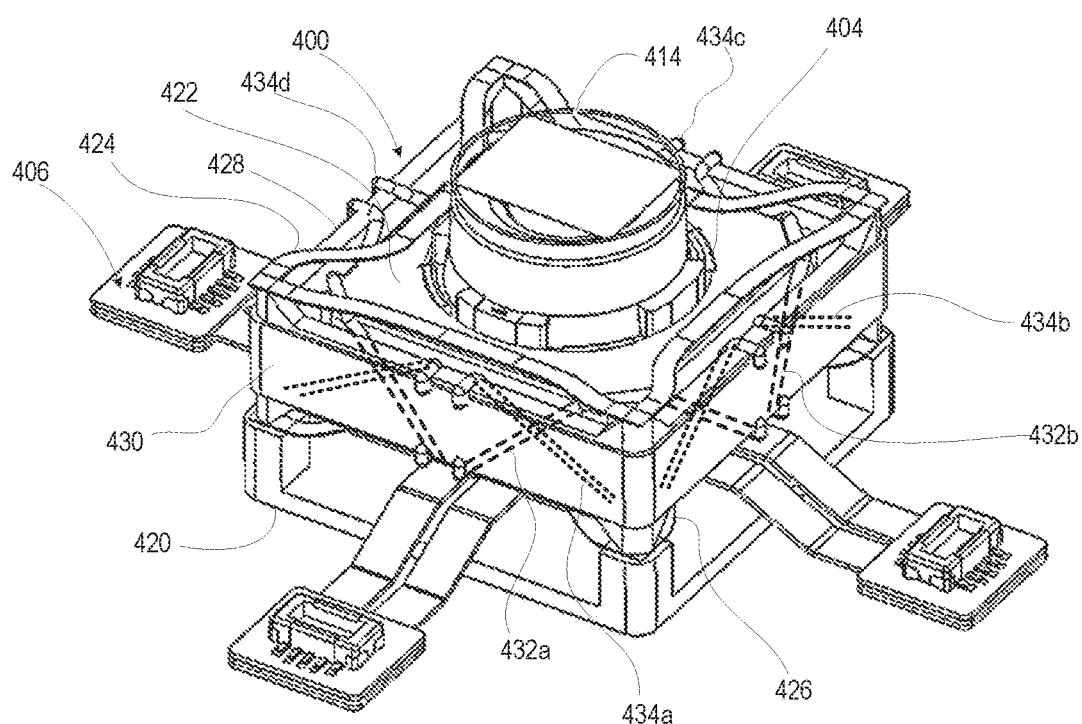
FIG. 5 is an isometric view of the example digital camera of FIG. 4 with shield can removed to expose suspension springs and shape memory alloy (SMA) actuators, according to one or more embodiments.
Figure 6:
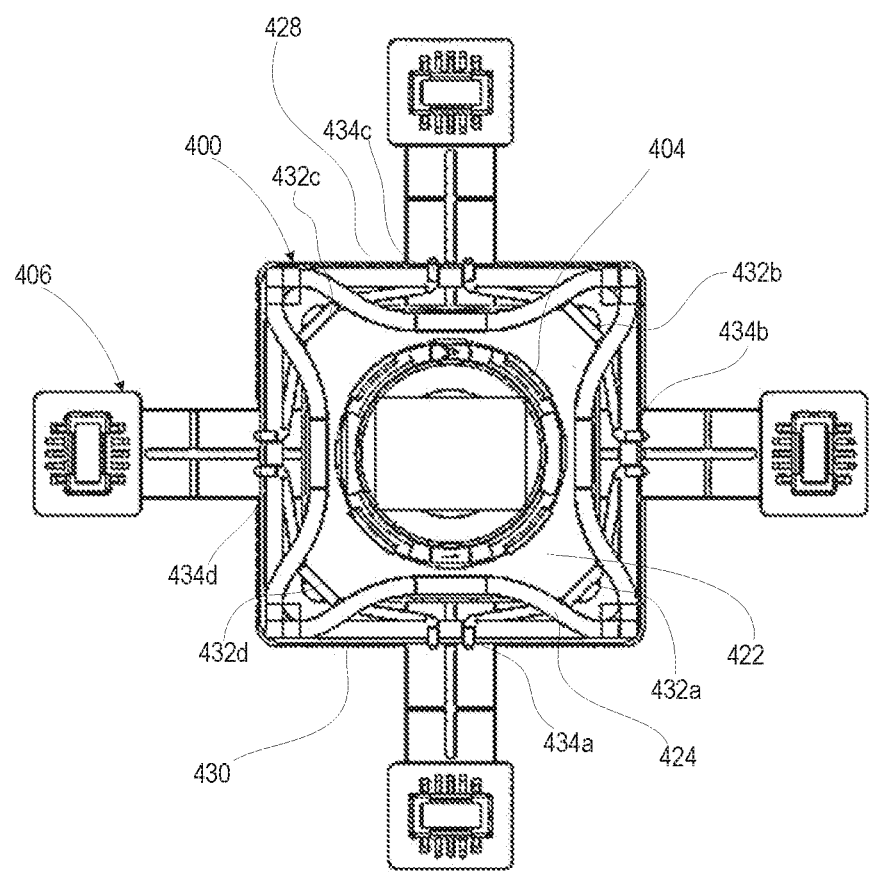
FIG. 6 is a top view of the example digital camera of FIG. 4, according to one or more embodiments.
Figure 7:
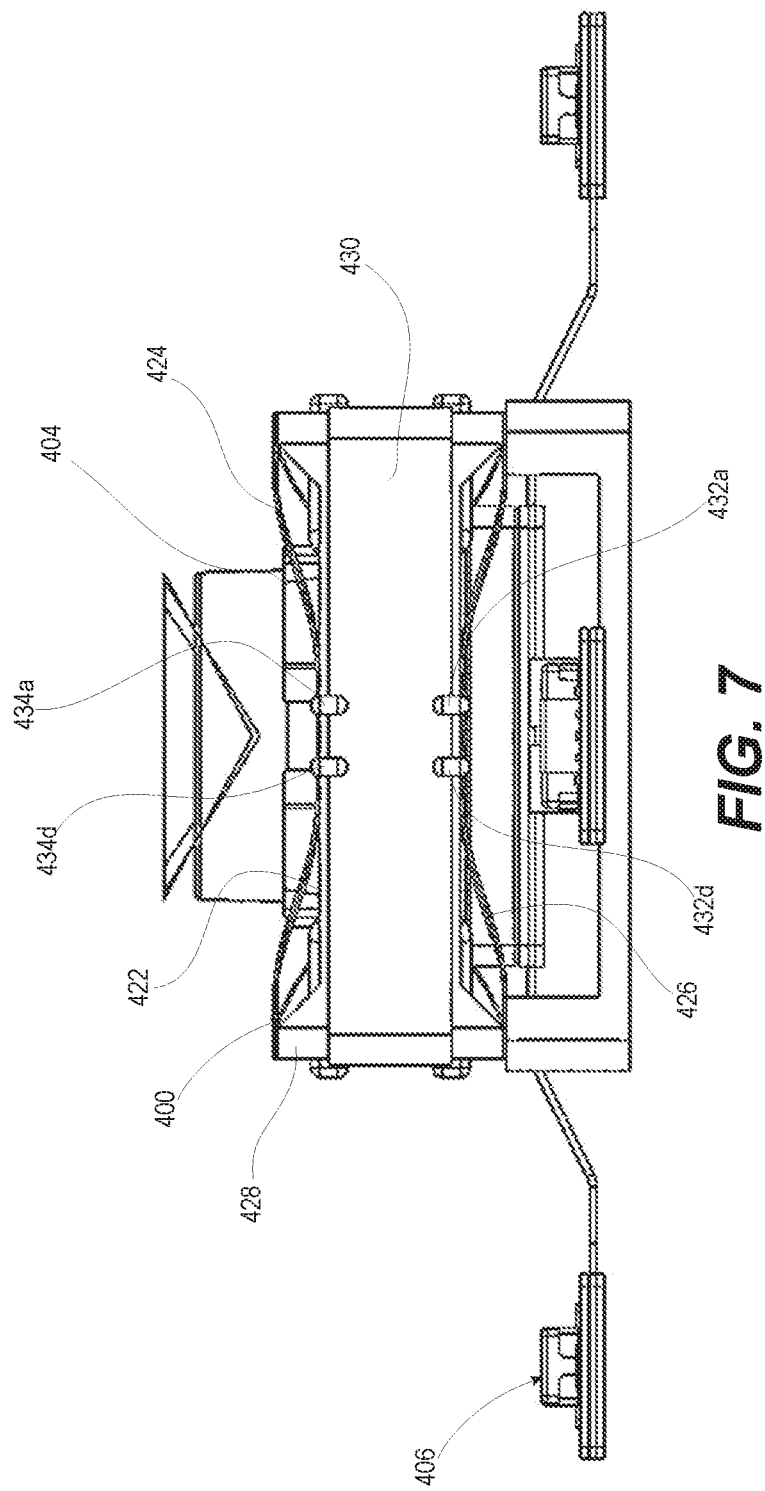
FIG. 7 is a side view of the example digital camera of FIG. 4, according to one or more embodiments.

FIG. 5 depicts example digital camera 400 without shield can 414 (FIG. 4) to expose internal components. FIG. 6 is a top view of example digital camera 400. FIG. 7 is a side view of example digital camera 400. With reference to FIGS. 5-7, camera module 404 includes square inner holder 422 that is suspended between four-sided upper and lower suspension springs 424, 426. Upper and lower suspension springs 424, 426 are attached respectively to top and bottom corners of outer harness 428 that surrounds and is spaced apart from inner holder 422 and is supported by holder base 420. Suspension springs 424, 426 (FIGS. 5, 7) provide a centering and restoring force to camera module 404. Flexible printed circuit board (FPCB) 430 closely encircles outer harness 428 and electrically connects to SMA actuators 432a-d, 434a-d. SMA actuators 432a-d are respectively attached between lower midpoint of adjacent sides of outer harness 428 and extend over top of a corner of inner holder 422 of camera module 404 to move the respective corner in +Z-axis. SMA actuators 434a-d are respectively attached between upper midpoints of adjacent sides of outer harness 428 and extend beneath a corner of inner holder 422 of camera module 404 to move the respective corner in −Z-axis. Selected SMA actuators 432a-d and 434a-d work together to form a couple moment to produce a desired rotation in any X-axis, Y-axis combination with minimal net force in the Z-axis, only rotational moment. Couple is something joined by two equal and opposite forces that act along parallel lines. A couple does not produce any translatory motion (i.e. motion in a straight line), but a couple produces a motion of rotation of the body on which it acts. Moment is a turning force produced by an object acting at a distance. Given two equal and opposite forces, couple moment is the product of the force and the distance between them. In one or more embodiments, SMA actuators 432a-d and 434a-d, operating with closed loop control, can overcome asymmetric forces required to rotate camera module 404. This configuration which has a single arm (not shown) of electrical interconnect 406 enables a smaller footprint by eliminating the other three arms.

Analysis of the design of digital camera 400 using SMA actuators compares favorably to generally-known pseudo rotation OIS performed by a voice coil motor (VCM). With regard to size, SMA actuators are 0-10% smaller in XY dimensions and enable lowest height of 0.3 mm thickness in Z dimension. Use of SMA actuators enable a larger lens size for the same footprint required by VCM implementation. Also, use of SMA actuators require no magnetic footprint that limits proximity to magnetic field producing components, whereas VCM requires about 6 mm zone that is free of magnetic fields.

With regard to performance, SMA actuators consume about 15-35 mA per axis, which is a reduction of a factor of 2-5 times less than VCM. Also, SMA actuators generate about 10-15° C. lower temperature than VCM, reducing heat impact to camera module 404. Lens tilt due to SMA actuators is 0.03 dynamic, which is 2-3 times less than VCM. SMA actuators produce high force that is 5-10 times as much as VCM. Higher force enables faster response and thus ability to counter a greater range of movement. SMA actuators achieve higher stability than VCMs, with no resonance mode up to 1 kHz, unlike VCM with resonance at 55 Hz.

Figure 8:
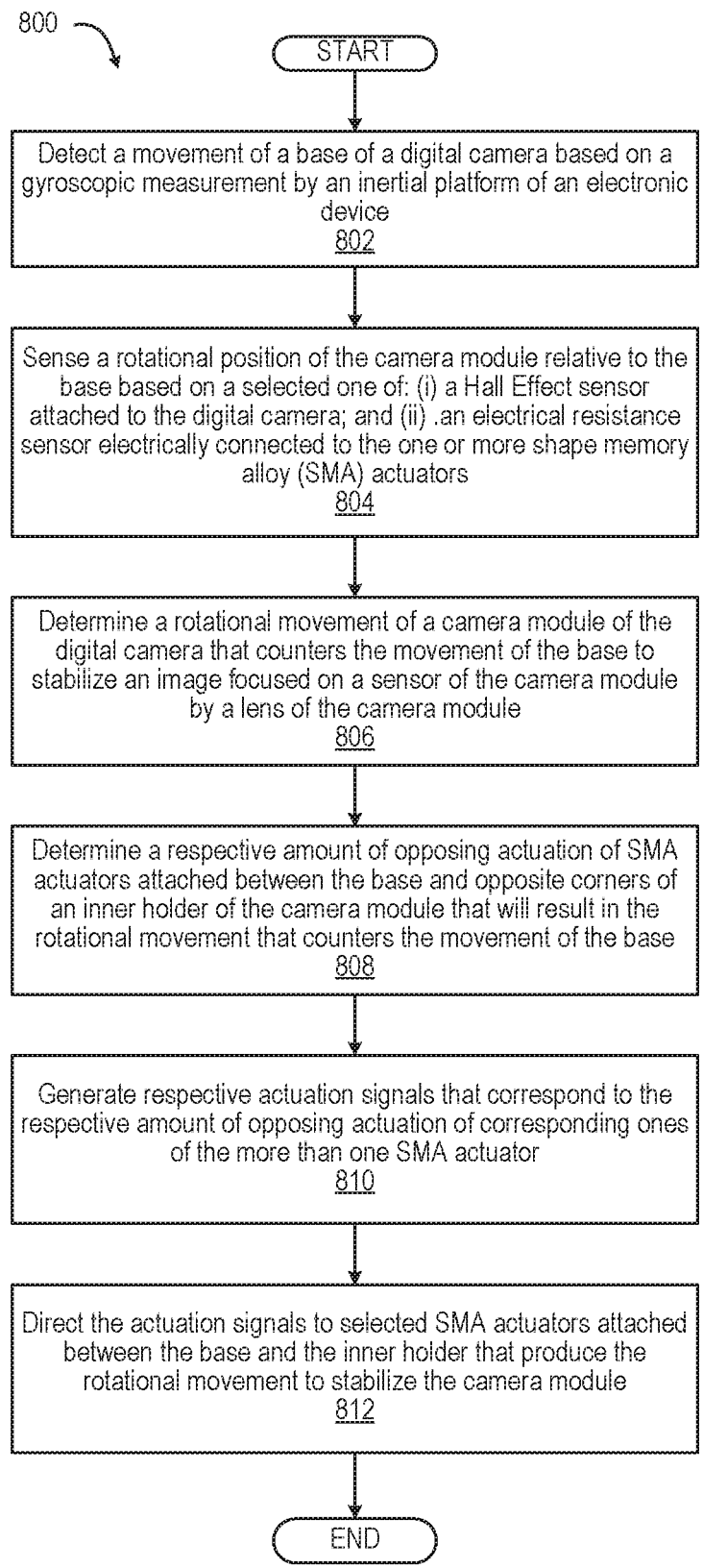
FIG. 8 is a flow diagram of a method for gimbal stabilizing video from a camera module using a miniature camera gimbal rotated by SMA actuators, according to one or more embodiments.

FIG. 8 depicts method 800 for gimbal stabilizing a video from camera module 157 (FIG. 1) using a miniature camera gimbal 156 (FIG. 1). Method 800 includes detecting a movement of a base of a digital camera 155 (FIG. 1) based on a gyroscopic measurement by an inertial platform of an electronic device (block 802). Method 800 includes sensing, by controller 106 (FIG. 1), a rotational position of the camera module relative to the base. In one or more embodiments, the sensing is performed by a selected one of: (i) a Hall Effect sensor attached to the digital camera; and (ii) an electrical resistance sensor electrically connected to the one or more shape memory alloy (SMA) actuators (block 804). Method 800 includes the controller determining a responsive rotational movement of a camera module of the digital camera that counters the movement of the base to stabilize an image focused on a sensor of the camera module by a lens of the camera module (block 806). Method 800 includes determining a respective amount of opposing actuation of SMA actuators attached between the base and opposite corners of an inner holder of the camera module that will result in the rotational movement that counters the movement of the base (block 808). Method 800 includes generating respective actuation signals that correspond to the respective amount of opposing actuation of corresponding ones of the more than one SMA actuator (block 810). Method 800 includes directing the actuation signals to selected SMA actuators attached between the base and the inner holder that produce the rotational movement to stabilize the camera module (block 812). Then, method 800 ends at end block In each of the above flow charts presented herein, certain steps of the methods can be combined, performed simultaneously or in a different order, or perhaps omitted, without deviating from the spirit and scope of the described innovation. While the method steps are described and illustrated in a particular sequence, use of a specific sequence of steps is not meant to imply any limitations on the innovation. Changes may be made with regards to the sequence of steps without departing from the spirit or scope of the present innovation. Use of a particular sequence is therefore, not to be taken in a limiting sense, and the scope of the present innovation is defined only by the appended claims.

Aspects of the present innovation are described above with reference to flowchart illustrations and/or block diagrams of methods, apparatus (systems) and computer program products according to embodiments of the innovation. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As will be appreciated by one skilled in the art, embodiments of the present innovation may be embodied as a system, device, and/or method. Accordingly, embodiments of the present innovation may take the form of an entirely hardware embodiment or an embodiment combining software and hardware embodiments that may all generally be referred to herein as a "circuit," "module" or "system."

While the innovation has been described with reference to exemplary embodiments, it will be understood by those skilled in the art that various changes may be made, and equivalents may be substituted for elements thereof without departing from the scope of the innovation. In addition, many modifications may be made to adapt a particular system, device or component thereof to the teachings of the innovation without departing from the essential scope thereof. Therefore, it is intended that the innovation not be limited to the particular embodiments disclosed for carrying out this innovation, but that the innovation will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the innovation. As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present innovation has been presented for purposes of illustration and description but is not intended to be exhaustive or limited to the innovation in the form disclosed. Many modifications and variations will be apparent to those of ordinary skill in the art without departing from the scope and spirit of the innovation. The embodiments were chosen and described in order to best explain the principles of the innovation and the practical application, and to enable others of ordinary skill in the art to understand the innovation for various embodiments with various modifications as are suited to the particular use contemplated.

What is claimed is:

1. A digital camera comprising:
  a gimbal having a base at a bottom of the gimbal;
  a camera module having four lateral sides and comprising:
    a lens that focuses an image; and
    a sensor rigidly attached to the lens and that detects the focused image; and
  one or more suspension members that hold the camera module horizontally within the gimbal, the one or more suspension members comprising a four-sided top suspension spring attached to a top portion of the gimbal and a four-sided bottom suspension spring attached to the base of the gimbal and extending from an exterior edge of the base of the gimbal upwards to provide a flat middle section below the camera module that abuts and supports a bottom surface of the camera module;
  one or more shape memory alloy (SMA) actuators attached between the base and the camera module, the one or more SMA actuators being separate components from the one or more suspension members; and
  an electrical interconnect that directs one or more actuating signals from a gimbal driver to the one or more SMA actuators to rotate the camera module, the one or more actuating signals generated in response to movement of the base to stabilize the image, the electrical interconnect comprising four identical flexible ribbon cables that are perpendicularly attached and centered on respective lateral sides of the camera module to balance a weight of the electrical interconnect supported by the camera module.

2. The digital camera of claim 1, wherein each cable of the four flexible ribbon cables comprises at least two conductors separated by a lengthwise slot that increases flexibility.

3. The digital camera of claim 1, wherein:
  the one or more suspension members enable at least two degrees of freedom of rotation of the camera module relative to the base and provide coordinated opposing vertical spacing changes of opposite sides of the camera module relative to the base; and
  the one or more suspension members are flexible and are deformed during actuation of the one or more SMA actuators and provide a restoring force to the camera module to hold the camera module horizontally within the gimbal when no actuating signal is applied to the one or more SMA actuators.

4. The digital camera of claim 1, wherein:
  the camera module comprises an inner holder mechanically attached to the lens and the sensor, the inner holder having corners extending laterally from the lens and the sensor;
  the outer harness surrounds lateral sides of the inner holder; and
  for each selected corner of the inner holder, the one or more SMA actuators comprise: (i) at least one upward SMA actuator attached between the outer harness and the selected corner, the at least one upward SMA actuator having an actuated state that moves the selected corner upward away from the underlying portion of the base; and (ii) at least one downward SMA actuator attached between the outer harness and the selected corner, the at least one downward SMA actuator having an actuated state that moves the selected corner downward towards the underlying portion of the base.

5. The digital camera of claim 1, wherein the at least one SMA actuator comprise SMA wire having a contracted length when activated and having an extended length when not activated that is longer than the contracted length.

6. The digital camera of claim 1, wherein the one or more suspension members provides a restoring force to each corner of the inner holder, the restoring force opposing upward and downward movement of each corner relative to an underlying portion of the base.

7. An electronic device comprising:
  a gimbal driver; and
  a digital camera comprising:
    a gimbal having a base at a bottom of the gimbal;
    a camera module having four lateral sides and comprising:
      a lens that focuses an image; and
      a sensor attached to the lens and that detects the focused image;
    one or more suspension members that hold the camera module horizontally within the gimbal, the one or more suspension members comprising a four-sided top suspension spring attached to a top portion of the gimbal and a four-sided bottom suspension spring attached to the base and extending from an exterior edge of the base of the gimbal upwards to provide a flat middle section below the camera module and that abuts and supports a bottom surface of the camera module;
    one or more shape memory alloy (SMA) actuators attached between the base and the camera module, the one or more SMA actuators being separate components from the one or more suspension members; and
    an electrical interconnect that directs one or more actuating signals from the gimbal driver to the one or more SMA actuators to rotate the camera module, the one or more actuating signals generated by the gimbal driver in response to movement of the base to stabilize the image, the electrical interconnect comprising four identical flexible ribbon cables that are perpendicularly attached and centered on respective lateral sides of the camera module to balance weight of the electrical interconnect supported by the camera module.

8. The electronic device of claim 7, wherein each cable of the four flexible ribbon cables comprises at least two conductors separated by a lengthwise slot that increases flexibility.

9. The electronic device of claim 7, wherein:
the one or more suspension members are flexible and are deformed during actuation of the one or more SMA actuators and provide a restoring force to the camera module to hold the camera module horizontally within the gimbal when no actuating signal is applied to the one or more SMA actuators; and
the one or more suspension members enable at least two degrees of freedom of rotation of the camera module relative to the base and provide coordinated opposing vertical spacing changes of opposite sides of the camera module relative to the base.

10. The electronic device of claim 9, wherein the one or more suspension members provides a restoring force to each corner of the inner holder, the restoring force opposing upward and downward movement of each corner relative to an underlying portion of the base.

11. The electronic device of claim 7, wherein:
the camera module comprises an inner holder mechanically attached to the lens and the sensor, the inner holder having corners extending laterally from the lens and the sensor;
the outer harness surrounds lateral sides of the inner holder; and
for each selected corner of the inner holder, the one or more SMA actuators comprise: (i) at least one upward SMA actuator attached between the outer harness and the selected corner, the at least one upward SMA actuator having an actuated state that moves the selected corner upward away from the underlying portion of the base; and (ii) at least one downward SMA actuator attached between the outer harness and the selected corner, the at least one downward SMA actuator having an actuated state that moves the selected corner downward toward the underlying portion of the base.

12. The electronic device of claim 11, wherein the at least one SMA actuator comprise SMA wire having a contracted length when activated and having an extended length when not activated that is longer than the contracted length.

13. The electronic device of claim 11, further comprising:
a motion sensor that detects the motion of the base of digital camera; and
a controller that is communicatively coupled to the motion sensor, the gimbal driver, and the sensor of the camera module, and that executes a stabilized video application that enables the electronic device to:
detect a movement of the electronic device, by the motion sensor;
determine a rotational movement of the camera module that counters the movement of the electronic device to stabilize the image in the sensor of the camera module;
determine a respective amount of opposing actuation of each pair of SMA actuators at opposite corners of the inner holder of the camera module that result in the rotational movement; and
generate the respective actuation signals by the gimbal driver that correspond to the respective amount of opposing actuation of corresponding ones of the more than one SMA actuator.

14. A method comprising:
detecting a movement of a base of a digital camera comprising: a gimbal with the base at a bottom of the gimbal a camera module; one or more suspension members that hold the camera module horizontally within the gimbal, the one or more suspension members comprising a four-sided top suspension spring attached to a top portion of the gimbal and a four-sided bottom suspension spring attached to the base and extending from an exterior edge of the base of the gimbal upwards to provide a flat middle section below the camera module and that abuts and supports a bottom surface of the camera module; an electrical interconnect comprising four identical flexible ribbon cables that are perpendicularly attached and centered on respective lateral sides of the camera module to balance weight of the electrical interconnect supported by the camera module; and one or more shape memory alloy (SMA) actuators attached between the base and the camera module, the one or more SMA actuators being separate components from the one or more suspension members;
wherein, the one or more suspension members are flexible and are deformed during actuation of the one or more SMA actuators and provide a restoring force to the camera module to hold the camera module horizontally within the gimbal when no actuating signal is applied to the one or more SMA actuators;
determining a rotational movement of the camera module of the digital camera that counters the movement of the base to stabilize an image focused on a sensor of the camera module by a lens of the camera module;
determining a respective amount of opposing actuation of selected shape memory alloy (SMA) actuators attached between the base and opposite corners of an inner holder of the camera module, the opposing actuation resulting in the rotational movement that counters the movement of the base;
generating respective actuation signals that correspond to the respective amount of opposing actuation of corresponding ones of the more than one SMA actuator; and
directing the actuation signals to selected SMA actuators that produce the rotational movement to stabilize the camera module.

15. The method of claim 14, further comprising:
determining the movement of the base based on a gyroscopic measurement by an inertial platform of an electronic device attached to the base; and
sensing a rotational position of the camera module relative to the base during actuation of the one or more SMA actuators; and
adjusting the one or more actuation signals using the rotational position of the camera module for closed loop control.

16. The method of claim 15, further comprising sensing the rotational position of the camera module based on a Hall Effect sensor attached to the digital camera.

17. The method of claim 15, further comprising sensing the rotational position of the camera module based on an electrical resistance sensor electrically connected to the one or more SMA actuators.

18. The method of claim 14, wherein:
the camera module comprises an inner holder mechanically attached to the lens and the sensor, the inner holder having corners extending laterally from the lens and the sensor; and
for each selected corner of the inner holder, the one or more SMA actuators comprise: (i) at least one upward SMA actuator attached between the outer harness and the selected corner, the at least one upward SMA actuator having an actuated state that moves the selected corner upward away from the underlying portion of the base; and (ii) at least one downward SMA actuator attached between the outer harness and the selected corner, the at least one downward SMA actuator having an actuated state that moves the selected corner downward toward the underlying portion of the base.

\* \* \* \* \*